US009234929B2

(12) United States Patent
Gao et al.

(10) Patent No.: US 9,234,929 B2
(45) Date of Patent: Jan. 12, 2016

(54) MONITORING METHOD AND SYSTEM AND INTEGRATED MONITORING DEVICE FOR ANTENNA OSCILLATOR OF BASE STATION (75) Inventors: Feng Gao, Beijing (CN); Jiwei He, Beijing (CN); Wentao Zhu, Beijing (CN); Yong Ding, Beijing (CN); Peng Gao, Beijing (CN); Jiping Mao, Beijing (CN); Yuanbo Cheng, Beijing (CN); Xingzheng Li, Beijing (CN)

(73) Assignees: CHINA MOBILE GROUP DESIGN INSTITUTE CO., LTD., Beijing (CN); GUANGDONG TONGYU COMMUNICATION INC., Guangdong (CN)

( * ) Notice: Subject to any disclaimer, the term of this patent is extended or adjusted under 35 U.S.C. 154(b) by 115 days.

(21) Appl. No.: 14/342,647

(22) PCT Filed: Apr. 10, 2012

(86) PCT No.: PCT/CN2012/073711
§ 371 (c)(1),
(2), (4) Date: Mar. 4, 2014

(87) PCT Pub. No.: WO2013/033990
PCT Pub. Date: Mar. 14, 2013

(65) Prior Publication Data
US 2014/0203977 A1    Jul. 24, 2014

(30) Foreign Application Priority Data

Sep. 8, 2011    (CN) .......................... 2011 1 0265386

(51) Int. Cl.
*G01R 29/10*    (2006.01)
*H04B 17/10*    (2015.01)
*H01Q 21/06*    (2006.01)

(52) U.S. Cl.
CPC ............... *G01R 29/10* (2013.01); *H04B 17/10* (2015.01); *H01Q 21/06* (2013.01)

(58) Field of Classification Search
USPC ............... 343/703, 850–858, 894; 455/67.11, 455/423–424
See application file for complete search history.

(56) References Cited

U.S. PATENT DOCUMENTS 4,359,740 A * 11/1982 Frazita ................... H01P 1/185
 343/703
4,639,732 A     1/1987 Acoraci et al.
(Continued)

FOREIGN PATENT DOCUMENTS

CN    101183905 A    5/2008
CN    101998452 A    3/2011
(Continued)

OTHER PUBLICATIONS

International Search Report (in Chinese with English translation) for PCT/CN2012/073711, mailed Jul. 19, 2012; ISA/CN.
(Continued)

*Primary Examiner* — Howard Williams
(74) *Attorney, Agent, or Firm* — Harness, Dickey & Pierce, P.L.C.

(57) ABSTRACT

Disclosed are a monitoring method and system and an integrated monitoring device for an antenna oscillator of a base station, which are used to monitor whether an anomaly occurs in the antenna oscillator of the base station. The monitoring method for an antenna oscillator of a base station in the present invention comprises: performing wave detection and analog-to-digital conversion on an obtained transmission signal of the antenna oscillator of the base station, to acquire a digital signal of a direct-current signal of the transmission signal; determining the amplitude of changes of the digital signal in a set time length, and when the amplitude of the changes is greater than a preset amplitude change threshold, determining that an anomaly occurs in the antenna oscillator; otherwise, determining that the antenna element is normal.

20 Claims, 9 Drawing Sheets

(56) References Cited

U.S. PATENT DOCUMENTS

| | | | |
|---|---|---|---|
| 5,086,302 A | | 2/1992 | Miller |
| 6,038,432 A | * | 3/2000 | Onoda ................ H01Q 3/2605 455/423 |
| 8,723,728 B2 | * | 5/2014 | He ....................... H04B 7/0652 342/372 |
| 2006/0252390 A1 | * | 11/2006 | Bendov ................ H01Q 1/002 455/117 |
| 2011/0050515 A1 | | 3/2011 | Liu |

FOREIGN PATENT DOCUMENTS

| | | |
|---|---|---|
| WO | WO-00/40050 A1 | 7/2000 |
| WO | 01/08259 A1 | 2/2001 |
| WO | 2009/092320 A1 | 7/2009 |

OTHER PUBLICATIONS

Extended European Search Report mailed Mar. 25, 2015 regarding PCT/CN2012/073711.

\* cited by examiner

MONITORING METHOD AND SYSTEM AND INTEGRATED MONITORING DEVICE FOR ANTENNA OSCILLATOR OF BASE STATION

CROSS-REFERENCE TO RELATED APPLICATIONS

This application is the 371 national phase of International Application No. PCT/CN2012/073711, titled "MONITORING METHOD AND SYSTEM AND INTEGRATED MONITORING DEVICE FOR ANTENNA OSCILLATOR OF BASE STATION", filed on Apr. 10, 2012, which claims priority to Chinese patent application No. 201110265386.5, titled "MONITORING METHOD AND SYSTEM AND INTEGRATED MONITORING DEVICE FOR ANTENNA OSCILLATOR OF BASE STATION" and filed with the State Intellectual Property Office on Sep. 8, 2011, the contents of which are hereby incorporated by reference in their entirety.

FIELD OF THE INVENTION

The invention relates to the field of communication technology, and in particular to a monitoring method and system and an integrated monitoring device for an antenna element of a base station.

BACKGROUND OF THE INVENTION

A base station antenna usually adopts a form in which elements form an array, to form electromagnetic wave beams having a higher gain and meeting a certain shape requirement to transfer a wireless communication signal. Presently, the base station antenna equipped with more elements becomes the mainstream gradually, particularly the intelligence antenna of Time Division Synchronized Code Division Multiple Access (TD-SCDMA) and the Multiple-Input Multiple-Output (MIMO) antenna of the Long Term Evolution (LTE) system, in which not only an array is formed in the vertical surface of the antenna, but also multiple columns of antenna arrays are needed to be formed in the horizontal surface.

The base station array antenna has many elements therein, when a certain antenna element can not work normally due to certain reason (such as short circuit or open circuit of feed), a reflection coefficient of the main port of the array will not generally deteriorate seriously, therefore, the base station will not send a standing wave alarm. However, the array pattern will be influenced obviously, for example a lobe pattern is not enough symmetrical, the side lobe suppression is poor, and the gain reduces and so on.

The prior art provides a standing wave monitoring circuit for monitoring a standing wave ratio of a base station antenna-feeder system and outputting different levels of alarm signals and a standing wave monitoring method based on the circuit. However, the circuit design for the monitoring method is complicated, the object to be monitored is a radio frequency signal at the junction between an antenna-feeder and a radio frequency terminal device, and the standing wave situation of the elements within the base station antenna can not be detected.

In summary, in the prior art, only the radio frequency signal between the radio frequency front-end circuit and the antenna-feeder port is monitored, different levels of alarm signals are sent when the standing wave of the radio frequency signal is abnormal. However, for a large antenna array, when an individual element within the antenna has abnormal situation, such as rosin joint, short circuit, or the mechanical structure of the element being broken, the standing wave of the radio frequency signal at the junction between the antenna-feeder and the radio frequency front-end circuit will not appear to be abnormal obviously, hence the abnormal situation of the element within the antenna array can not be detected.

SUMMARY OF THE INVENTION

The embodiments of the invention provide a monitoring method and system and an integrated monitoring device for an antenna element of a base station, which can be used to monitor whether the antenna element of the base station is abnormal.

A monitoring method for an antenna element of a base station provided by the embodiments of the invention includes:

performing detection and analog-to-digital conversion to an acquired transmission signal of the antenna element of the base station, to obtain a digital signal of a direct current signal of the transmission signal; and determining a change amplitude of the digital signal within a set time period, and if the change amplitude is greater than a preset change amplitude threshold, determining that the antenna element is abnormal, and if the change amplitude is not greater than the preset change amplitude threshold, determining that the antenna element is normal.

A monitoring system for an antenna element of a base station provided by an embodiment of the invention includes:

a signal acquiring unit, configured to acquire a transmission signal of the antenna element of the base station; and an integrated monitoring device, configured to: perform detection and analog-to-digital conversion to the acquired transmission signal of the antenna element of the base station, to obtain a digital signal of a direct current signal of the transmission signal; determine a change amplitude of the digital signal within a set time period; if the change amplitude is greater than a preset change amplitude threshold, determine that the antenna element is abnormal; and if the change amplitude is not greater than the preset change amplitude threshold, determine that the antenna element is normal.

An integrated monitoring device provided by an embodiment of the invention includes:

a logarithmic detector, configured to receive a transmission signal of an antenna element of a base station, and perform detection to the transmission signal to output a direct current signal of the transmission signal of the antenna element of the base station to an analog-to-digital converter;

an analog-to-digital converter, configured to convert the direct current signal of the transmission signal of the antenna element of the base station into a digital signal, and output the digital signal to a microcontroller; and a microcontroller, configured to: determine a change amplitude of the digital signal within a set time period; if the change amplitude is greater than a preset change amplitude threshold, determine that the antenna element is abnormal; and if the change amplitude is not greater than the preset change amplitude threshold, determine that the antenna element is normal.

Another integrated monitoring device provided by an embodiment of the invention includes at least one control unit, wherein each control unit includes:

a toggle switch, configured to select a transmission signal of an antenna element of a base station and output the transmission signal to a detector;

a detector, configured to receive the transmission signal of the antenna element of the base station output from the toggle switch, perform detection to the transmission signal to output a direct current signal of the transmission signal of the antenna element of the base station to a controller; and a controller, configured to convert the direct current signal of the transmission signal of the antenna element of the base station into a digital signal; determine a change amplitude of the digital signal within a set time period; if the change amplitude is greater than a preset change amplitude threshold, determine that the antenna element is abnormal; and if the change amplitude is not greater than the preset change amplitude threshold, determine that the antenna element is normal.

According to the embodiments of the invention, detection and analog-to-digital conversion are performed to the acquired transmission signal of the antenna element of the base station to obtain a digital signal of a direct current signal of the transmission signal; a change amplitude of the digital signal within a set time period is determined, and if the change amplitude is greater than a preset change amplitude threshold, it is determined that the antenna element is abnormal, otherwise, it is determined that the antenna element is normal, thereby monitoring whether each element within the base station antenna is abnormal is achieved.

DETAILED DESCRIPTION OF THE INVENTION

The embodiments of the invention provide a monitoring method and system and an integrated monitoring device for an antenna element of a base station, which can be used to monitor whether the antenna element of the base station is abnormal. The technical schemes provided by the embodiments of the invention are illustrated hereinafter in conjunction with the accompanying drawings.

Figure 1:
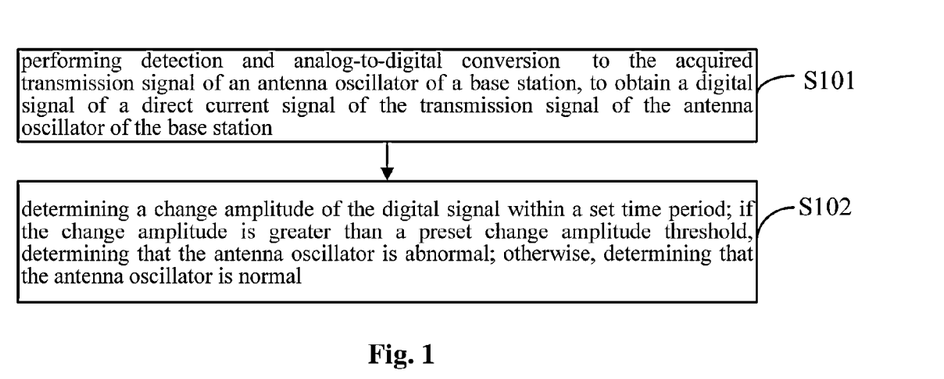
FIG. 1 is a flow schematic diagram of a monitoring method for an antenna element of a base station provided by an embodiment of the invention.

Referring to FIG. 1, a monitoring method for an antenna element of a base station provided by an embodiment of the invention includes the following steps:

S101, performing detection and analog-to-digital conversion on an acquired transmission signal of the antenna element of the base station, to obtain a digital signal of a direct current signal of the transmission signal of the antenna element of the base station;

S102, determining a change amplitude of the digital signal within a set time period, and if the change amplitude is greater than a preset change amplitude threshold, determining that the antenna element is abnormal, otherwise, determining that the antenna element is normal.

Specifically, the above method provided by the embodiment of invention may be achieved by installing a corresponding device outside of the antenna element of the base station, or installing a corresponding device inside of the base station antenna, it is not defined specifically herein.

Preferably, in the above step S101, the specific method for acquiring the transmission signal of the antenna element of the base station may include the following ways.

1. A transmission signal of each last stage power divider circuit of a base station is coupled by a radio frequency coupler, in which each last stage power divider circuit connects two or more elements with a same polarization.

That is to say, each last stage power divider circuit of the base station antenna corresponds to two radio frequency couplers, one radio frequency coupler is used to couple with a transmission signal of one polarized antenna, and the other radio frequency coupler is used to couple with a transmission signal of another polarized antenna, i.e., the radio frequency coupler is in a one-to-one correspondence with each polarized antenna element.

2. A transmission signal of a second last stage power divider circuit (i.e., the previous stage power divider circuit of the last stage power divider circuit) of a base station antenna is coupled by a radio frequency coupler, each second last stage power divider circuit corresponds to two radio frequency couplers, one radio frequency coupler is used to couple with a transmission signal of an antennas with a same polarization connected therewith, the other radio frequency coupler is used to couple with a transmission signal of another polarized antennas connected therewith. At this time, each radio frequency coupler corresponds to more than two antenna elements.

In a similar way, a transmission signal of any stage power divider circuit previous to the second last stage power divider circuit (the initial stage power divider circuit is a first stage power divider circuit) of a base station antenna is coupled by a radio frequency coupler. Each stage power divider circuit corresponds to two radio frequency couplers, one radio frequency coupler is used to couple a transmission signal of an antennas with a same polarization connected therewith, and the other radio frequency coupler is used to couple a transmission signal of another polarized antennas connected therewith.

The energy that the radio frequency coupler obtains from the power divider circuit by coupling may be set according to the specific actual application requirements, which generally is a certain value in a range of 15 dB~25 dB.

The above two ways are both achieved by arranging the radio frequency coupler at a corresponding position inside the base station antenna.

3. A transmission signal of an antenna element of a base station is sensed by a magnetic ring sensor.

The magnetic ring sensor may be installed outside of the base station antenna, the magnetic ring sensor is arranged above each antenna radiation oscillating element of the base station, a transmission signal of each radiation oscillating element is sensed by the electromagnetic induction of the magnetic ring sensor, thereby the transmission signal of each element is extracted; furthermore, the magnetic ring sensor is arranged outside of the base station antenna, without changing the internal structure of the base station antenna, and the external magnetic ring sensor is detachable, hence it is convenient to be used repeatedly on other same type of base station antennas for monitoring.

Preferably, in the above step S102, monitoring whether the antenna element of the base station is abnormal according to the preset change amplitude threshold may include:

if the change amplitude of the digital signal within the set time period is greater than the change amplitude threshold, determining that the antenna element corresponding to the digital signal is abnormal, otherwise, determining that the antenna element corresponding to the digital signal is normal.

The set time period described above may be set according to the specific actual application requirement, such as 1 second, 1 minute or 1 hour, it is not defined herein.

In addition, the preset change amplitude threshold may be set according to the specific actual application requirement, which generally is in a range of 1.5 dB~2 dB.

Preferably, after determining that the antenna element corresponding to the digital signal is abnormal, the above method provided by the embodiment of the invention further includes:

generating an alarm signal corresponding to the antenna element, and sending the alarm signal to a control platform via a radio frequency cable, or embedding the alarm signal into a radio frequency signal transmitted by the antenna element of the base station with the Antenna Interface Standards Group (AISG) protocol and sending the radio frequency signal to the control platform via a radio frequency cable connecting an antenna port with the base station, or sending the alarm signal to the control platform wirelessly.

The control platform described above is configured to monitor in real time whether the antenna element is abnormal.

According to the embodiments of the invention, the transmission signal of the power divider circuit may be coupled by the radio frequency coupler arranged on the feed network power divider circuit inside the antenna array; the transmission signal may be a radio frequency signal or a radio frequency reflected signal, and a direct current digital signal is extracted by a detection circuit and an analog-to-digital conversion circuit. When a certain element in the antenna array is damaged, the impedance matching of the feed network fails, the radio frequency reflected signal on the corresponding power divider circuit is enhanced, and the direct current portion of the extracted reflected signal is enhanced accordingly. By monitoring the change of strength of the direct current signal, whether the element works abnormally can be determined, thereby the work state of the whole antenna array is monitored comprehensively.

According to the embodiments of the invention, the transmission signal of each element may be sensed by the magnetic ring sensor arranged outside of the antenna array, the transmission signal may be a radio frequency signal or a radio frequency reflected signal, and a direct current digital signal is extracted by a detection circuit and an analog-to-digital conversion circuit. When a certain element in the antenna array is damaged, and the radio frequency signal of the radiation oscillating element is weakened, the direct current portion of the extracted radio frequency signal will be weakened accordingly. By monitoring the change of the strength of the direct current signal, whether the element works abnormally can be determined, thereby the work state of the whole antenna array is monitored comprehensively.

The specific embodiments are illustrated hereinafter.

The principle of the technical schemes of the embodiments of the invention is illustrated by taking a 2×4 dual-polarized planar array as an example.

The first type: a transmission signal of the power divider circuit is coupled by the radio frequency coupler arranged on the feed network power divider circuit inside the antenna array, to acquire the transmission signal of the antenna element of the base station.

Figure 2:
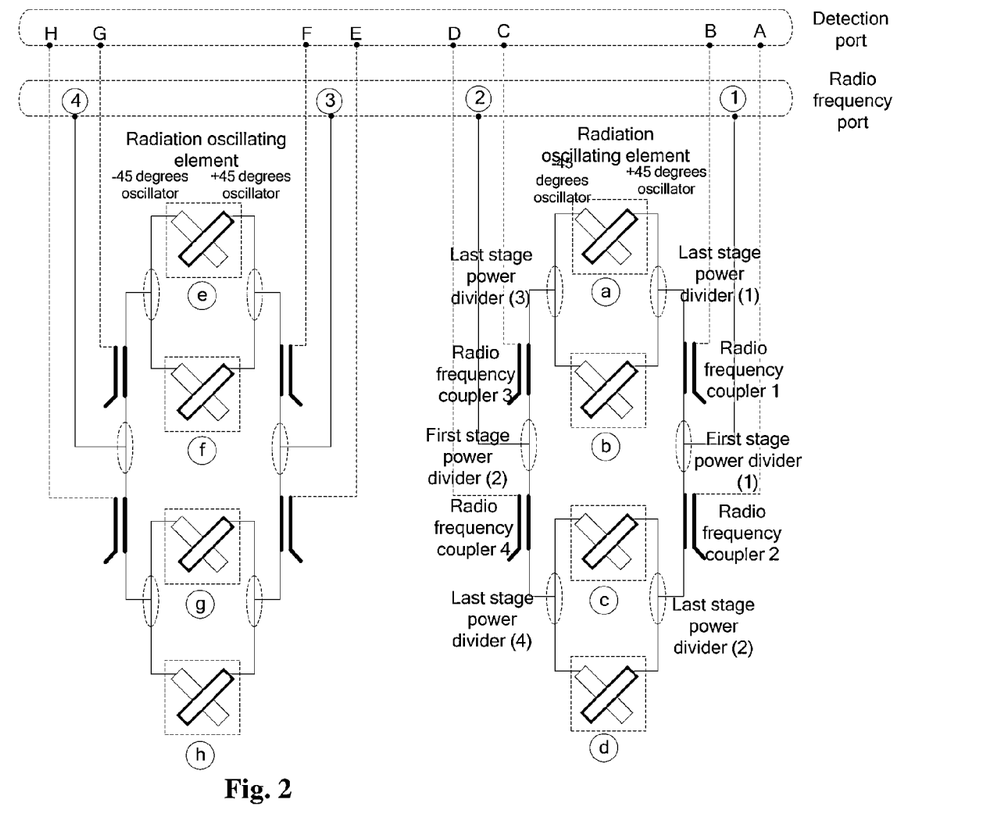
FIG. 2 is a schematic diagram of arranging a radio frequency coupler and a detection port on a 2×4 planar antenna array of a base station according to an embodiment of the invention.

For example, FIG. 2 shows a common 2×4 planar antenna array. The antenna array has 2 columns, each column has 4 elements, each element has 2 cross feed ports, which support a dual-polarized work mode; in this way the antenna has 4 radio frequency ports in total, which are port 1, port 2, port 3 and port 4 respectively. Port A to port H are detection ports for monitoring the antenna element of the base station in the embodiment of the invention.

Port 1 is taken as an example, a transmission signal input from port 1 passes through a first stage power divider circuit (1), and enters a second stage power divider circuit, i.e., a last stage power divider circuit (1) and a last stage power divider circuit (2). A radio frequency coupler 1 and a radio frequency coupler 2 are respectively arranged near the last stage power divider circuit (1) and the last stage power divider circuit (2). Radio frequency signals coupled by the radio frequency coupler 1 and the radio frequency coupler 2 are transmitted to port B and port A via a circuit. Port B and port A are connected to an integrated monitoring device at the back end via a radio frequency cable.

For other ports, the principle is the same as that of port 1, one can refer to FIG. 2 for this, which will not be described in detail herein.

Figure 3:
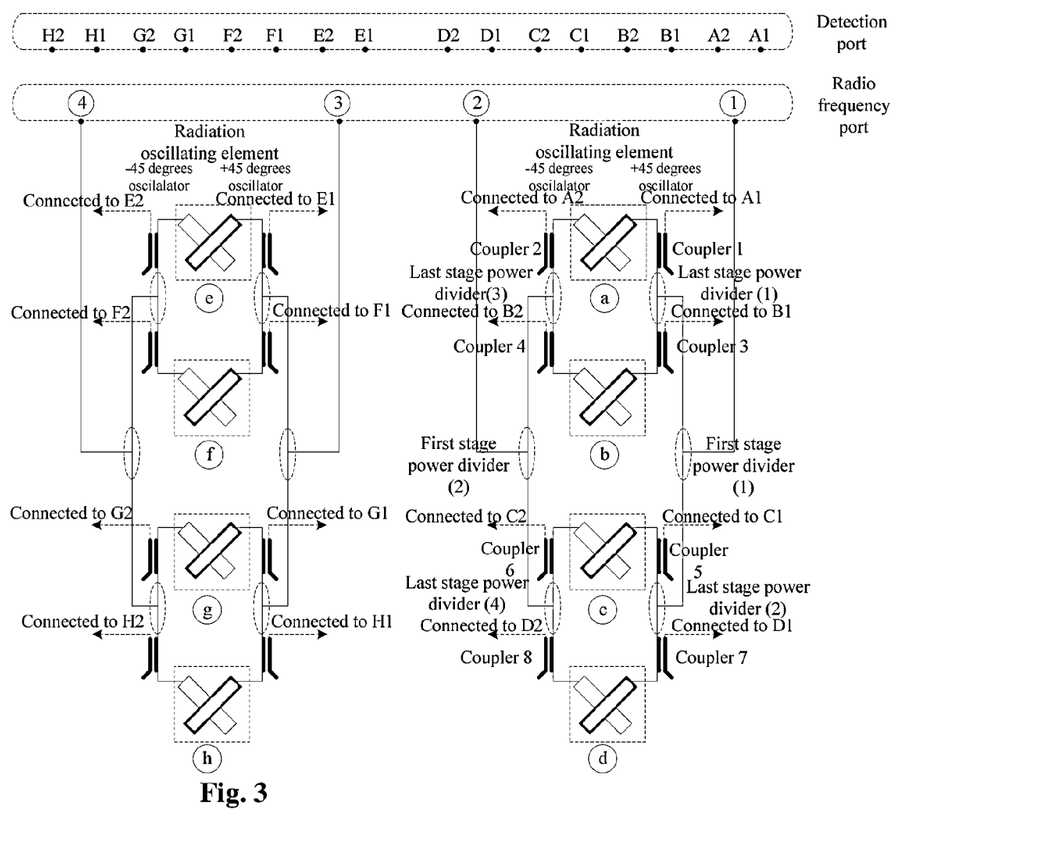
FIG. 3 is a schematic diagram of arranging a radio frequency coupler and a detection port on a 2×4 planar antenna array of a base station according to an embodiment of the invention.

As another example, FIG. 3 also shows a common 2×4 planar antenna array. The embodiment differs from the embodiment described above in that: the number of detection ports is increased, A1 to H2 are all detection ports for monitoring the antenna elements of the base station. Accordingly, the number of radio frequency coupler is also increased. In FIG. 2, the radio frequency couplers are arranged by taking the last stage power divider circuit as a unit, while in FIG. 3, the radio frequency couplers are arranged by taking the element as a unit.

According to the way of arranging the radio frequency coupler and the detection port shown in FIG. 3, the work status of each polarized element of each radiation oscillating element can be detected. For example, referring to FIG. 3, a coupler 1 is used to couple a signal of +45 degrees polarized element of the radiation oscillating element a and transmit it to port A1, hence the detecting result corresponding to the signal output from port A1 shows the work status of the +45 degrees polarized element of the radiation oscillating element a.

However, according to the way of arranging the radio frequency coupler and the detection port shown in FIG. 2, the work status of the two elements with a same polarization corresponding to each last stage power divider circuit can be detected. For example, referring to FIG. 2, a coupler 1 is used to couple signals of +45 degrees polarized elements of the radiation oscillating elements a and b and send them to port B, hence the detecting result corresponding to the signal output from port B shows the work status of the +45 degrees polarized elements of the radiation oscillating elements a and b.

The second type: a transmission signal of each element is sensed by a magnetic ring sensor arranged outside of the antenna array, to acquire the transmission signal of the antenna element of the base station.

Figure 4:
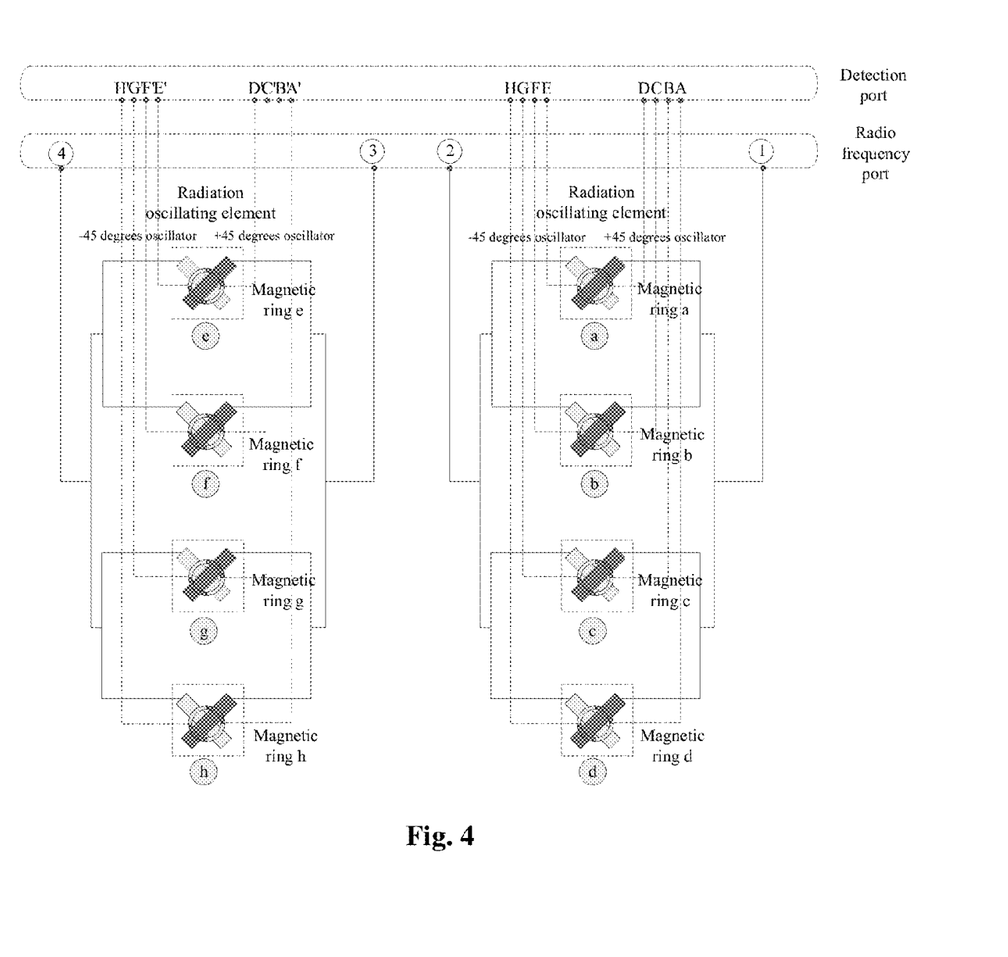
FIG. 4 is a schematic diagram of arranging a magnetic ring sensor and a detection port on a 2×4 planar antenna array of a base station according to an embodiment of the invention.

FIG. 4 shows a common 2×4 planar antenna array. The antenna array has 2 columns, each column has 4 elements (the 4 elements are a, b, c, d respectively), each element has 2 cross feed ports, which support the dual-polarized work mode. In this way the antenna array has 4 radio frequency ports, which are port 1, port 2, port 3 and port 4 respectively. Port A to Port H are detection ports for monitoring the antenna element of the base station in the embodiment of the invention.

The external magnetic ring sensors a to h are arranged above each oscillating element of the base station antenna. A radio frequency signal is extracted by each magnetic ring sensor above the oscillating element, the radio frequency signal is transmitted to a corresponding port via a circuit, and the port is connected to an integrated monitoring device at the back end via a radio frequency cable.

Based on the same invention concept, the embodiments of the invention further provide a monitoring system and an integrated monitoring device for an antenna element of a base station. Since the principle for solving problems of the system and the device is similar to that of the monitoring method for an antenna element of a base station described above, the implementation of the system and the device may refer to the implementation of the method, the repeated part will not be described herein.

Figure 5:
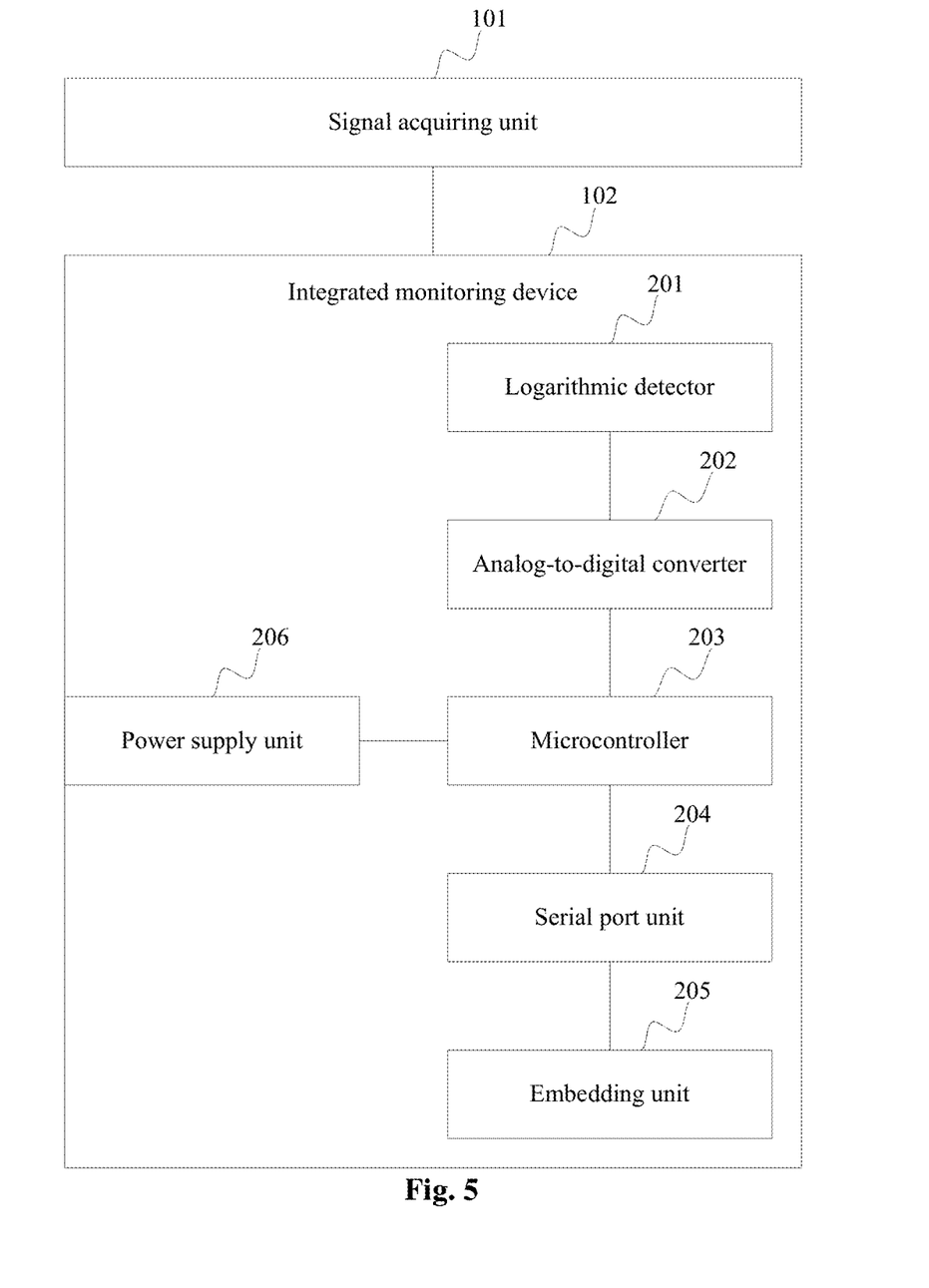
FIG. 5 is a schematic structural diagram of a monitoring system for an antenna element of a base station provided by an embodiment of the invention.

Referring to FIG. 5, a monitoring system for an antenna element of a base station provided by an embodiment of the invention includes:

a signal acquiring unit 101, configured to acquire a transmission signal of the antenna element of the base station. For example, the transmission signals on port A to port H in FIG. 2 are uniformly output to an integrated monitoring device 102;

an integrated monitoring device 102, configured to: perform detection and analog-to-digital conversion on the acquired transmission signal of the antenna element of the base station, to obtain a digital signal of a direct current signal of the transmission signal; determine a change amplitude of the digital signal within a set time period; and monitor whether the antenna element is normal according to a preset change amplitude threshold. Specifically, when the change amplitude is greater than the preset change amplitude threshold, it is determined that the antenna element is abnormal, otherwise, it is determined that the antenna element is normal.

The integrated monitoring device 102 may be obtained by integrating a radio frequency power sensor circuit, a radio frequency switch circuit, a microprocessor circuit, a power supply interface, a communication interface and so on together.

Preferably, the signal acquiring unit 101 may include a radio frequency coupler corresponding to each power divider circuit of a certain stage of the base station antenna, in which a corresponding radio frequency coupler is arranged near each branch of the power divider circuit. The radio frequency coupler is arranged inside the base station antenna.

For example, the signal acquiring unit 101 includes a radio frequency coupler for each last stage power divider circuit of the base station; or the signal acquiring unit 101 includes a radio frequency coupler for each second last stage power divider circuit of the base station.

Preferably, the signal acquiring unit 101 may also include a magnetic ring sensor for sensing a transmission signal of each antenna element of the base station. The magnetic ring sensor described above is arranged outside of the base station antenna.

In practice, the integrated monitoring device 102 provided by the embodiment of the invention may be manufactured as an individual product, it may also be integrated into the same product with the signal acquiring unit 101, it is not defined herein.

As shown in FIG. 5, one structure of an integrated monitoring device 102 provided by an embodiment of the invention includes:

a logarithmic detector 201, configured to receive a transmission signal of an antenna element of a base station, and perform detection to the transmission signal to output a direct current signal of a radio frequency signal of the antenna element of the base station to an analog-to-digital converter 202;

an analog-to-digital converter 202, configured to convert the direct current signal of the radio frequency signal of the antenna element of the base station into a digital signal, and output the digital signal to a microcontroller 203; and a microcontroller 203, configured to determine a change amplitude of the digital signal within a set time period, and if the change amplitude is greater than a preset change amplitude threshold, determine that the antenna element is abnormal, otherwise, determine that the antenna element is normal.

Preferably, the integrated monitoring device 102 described above further includes a serial port unit 204, in which:

the microcontroller 203 is also configured to generate an alarm signal corresponding to the antenna element after it is determined that the antenna element is abnormal, and output the alarm signal to the serial port unit 204;

the serial port unit 204 is configured to convert the alarm signal into a serial signal and send the serial signal to a control platform; and the serial port unit 204 may send the alarm signal to a control platform via a radio frequency cable, or may send the alarm signal to the control platform wirelessly.

Or, there is an embedding unit 205 between the serial port unit 204 and the control platform described above, in which:

the serial port unit 204 is also configured to convert the alarm signal into a serial signal and send the serial signal to the embedding unit 205; and the embedding unit 205 is configured to embed the serial signal into a radio frequency signal transmitted by the antenna element of the base station with the Antenna Interface Standards Group (AISG) protocol, and send the radio frequency signal to the control platform via the radio frequency cable connecting an antenna port with the base station.

In a specific implementation, the integrated monitoring device 102 further includes a power supply unit 206 for supplying power to the microcontroller 203.

The logarithmic detector 201 may be a MAX2015 type logarithmic detector. The serial port unit 204 may be a RS485 type serial port unit.

In addition, in the integrated monitoring device 102, the analog-to-digital converter 202 and the microcontroller 203 may be integrated on one chip. For example, the functions of the analog-to-digital converter 202 and the microcontroller 203 are achieved by an LPC1751 type chip.

Figure 6:
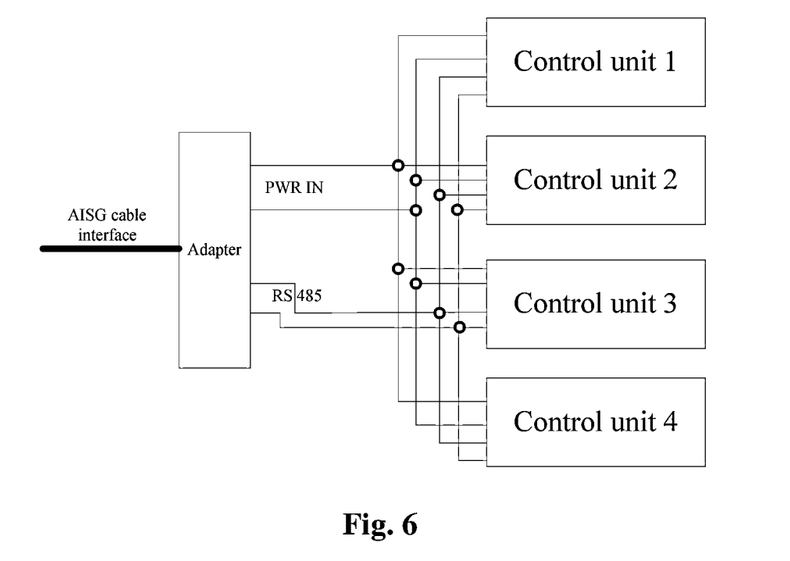
FIG. 6 is a schematic structural diagram of an integrated monitoring device provided by an embodiment of the invention.
Figure 7:
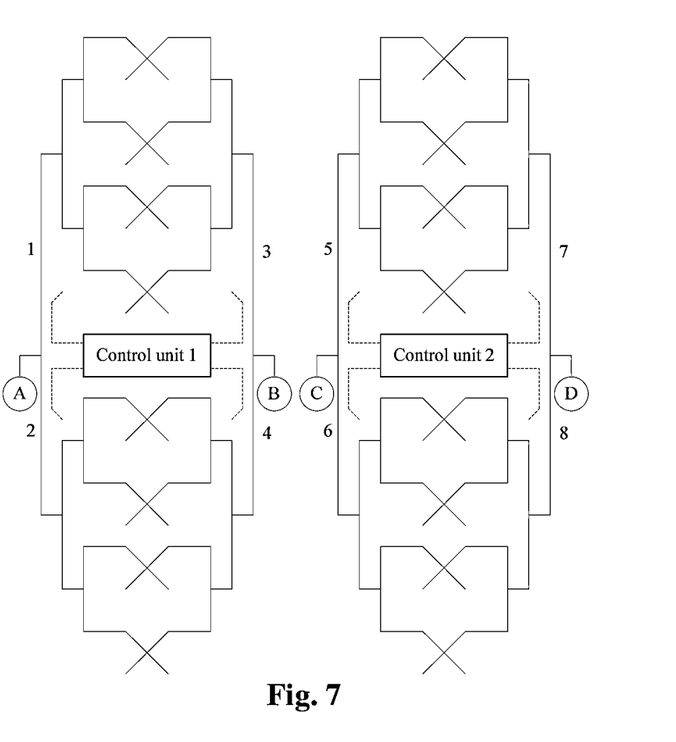
FIG. 7 is a schematic structural diagram of arranging a control unit on a base station antenna according to an embodiment of the invention.

FIG. 6 shows another structure of an integrated monitoring device 102 provided by an embodiment of the invention, the integrated monitoring device includes at least one control unit, in which each control unit can control a column of elements in the antenna array, as shown in FIG. 7.

Figure 8:
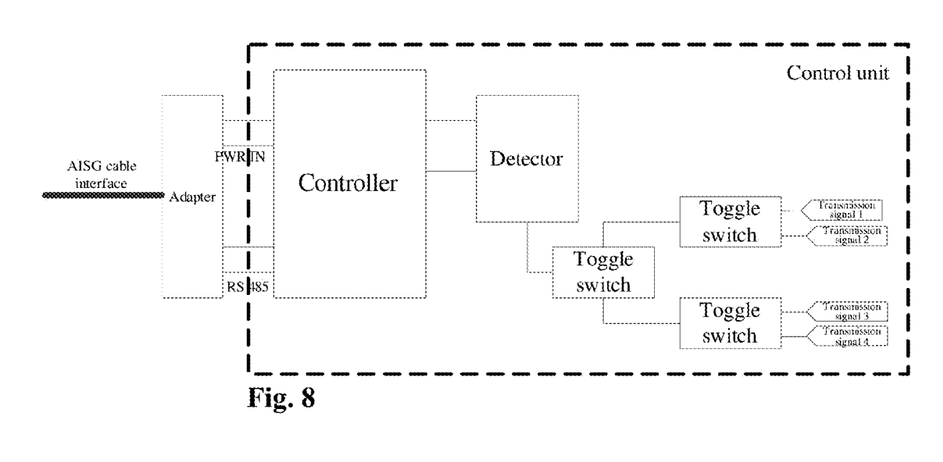
FIG. 8 is a schematic structural diagram of a control unit provided by an embodiment of the invention.

The specific structure of each control unit is shown in FIG. 8, which includes:

a toggle switch, configured to select a transmission signal of an antenna element of a base station and output the transmission signal to a detector;

a detector, configured to receive the transmission signal of the antenna element of the base station output from the toggle switch, and perform detection to the transmission signal to output a direct current signal of the transmission signal of the antenna element of the base station to a controller; and a controller, configured to: convert the direct current signal of the antenna element of the base station into a digital signal; determine a change amplitude of the digital signal within a set time period; if the change amplitude is greater than a preset change amplitude threshold, determine that the antenna element is abnormal; otherwise, determine that the antenna element is normal.

Preferably, as shown in FIG. 6, the integrated monitoring device further includes an adapter connected with each control unit;

the controller is also configured to generate an alarm signal corresponding to the antenna element after it is determined that the antenna element is abnormal, and output the alarm signal to the adapter; and the adapter is configured to convert the received alarm signal into a serial signal and send the serial signal to a control platform.

Preferably, the integrated monitoring device described above further includes an embedding unit, in which:

the adapter is also configured to convert the received alarm signal into a serial signal and send the serial signal to the embedding unit; and the embedding unit is configured to embed the serial signal into a radio frequency signal transmitted by the antenna element of the base station with the AISG protocol, and send the radio frequency signal to a control platform via a radio frequency cable connecting an antenna port with the base station.

Figure 9:
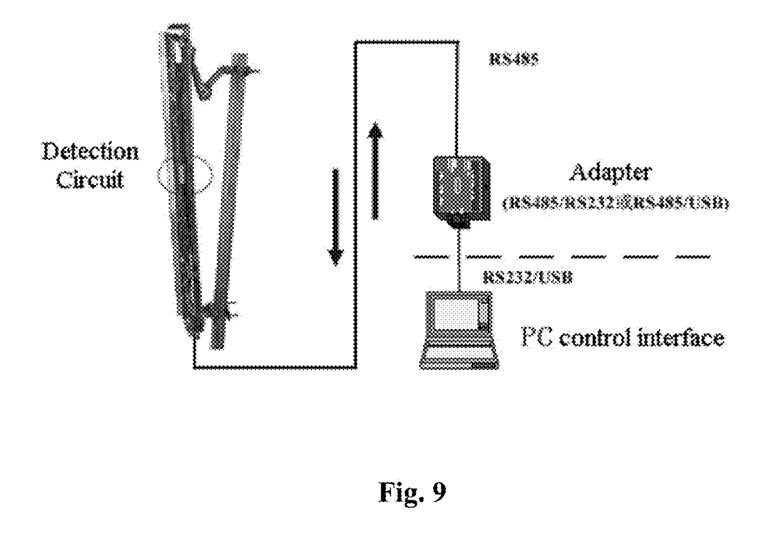
FIG. 9 is a schematic diagram of connecting a monitoring system to a PC according to an embodiment of the invention.

As shown in FIG. 9, the adapter is mainly configured to perform the conversion from RS485 to RS232. RS485 has a lower transmission loss, hence it is convenient to achieve long distance signal transmission; while RS232 interface is easy to be connected with a PC, and hence it is convenient for controlling.

Figure 10:
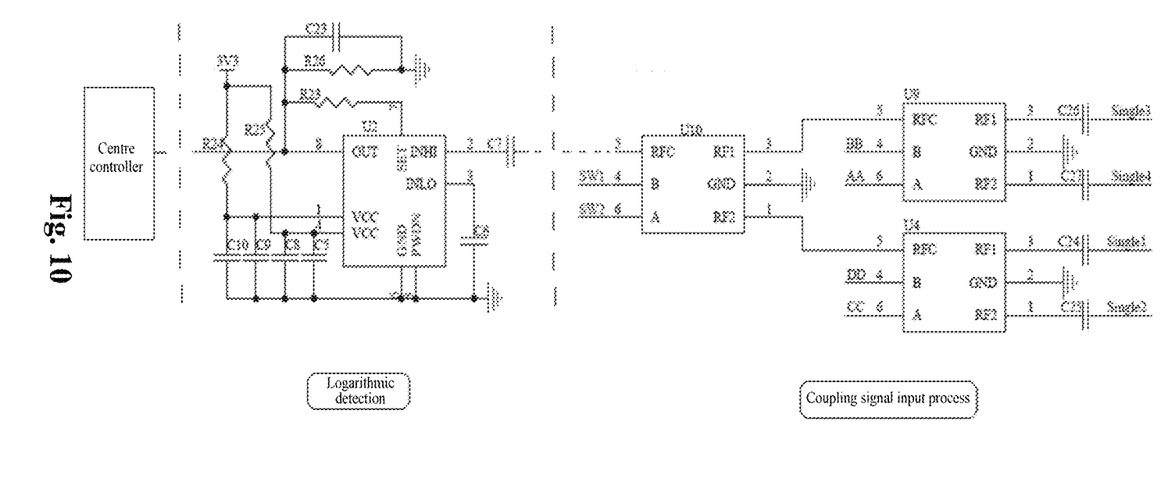
FIG. 10 is a circuit diagram of a control unit provided by an embodiment of the invention.

The specific circuit diagram of the control unit described above is shown in FIG. 10. Preferably, the control unit has multiple toggle switches which are connected in a cascade way. Pins RF1 and RF2 of the toggle switch are configured for inputting transmission signals of different antenna elements of the base station respectively, a pin RFC of the toggle switch is configured for outputting the transmission signal of the antenna element selected by the toggle switch to a detector or the next stage toggle switch.

Figure 11:
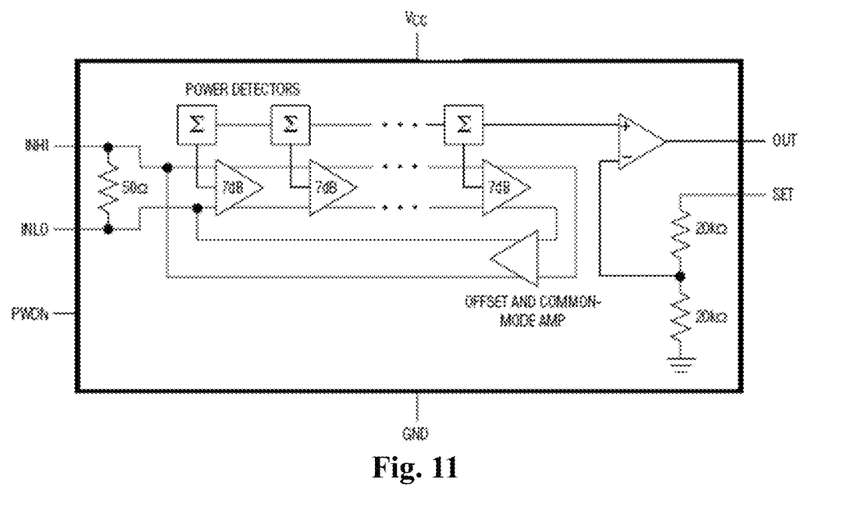
FIG. 11 is a circuit diagram of a MAX2015 provided by an embodiment of the invention.

The detector may be a MAX2015 type multi-stage logarithmic amplifier, the internal structure of which is shown in FIG. 11, and which is configured to accurately convert the transmission signal power within a frequency range between 0.1 GHz and 3 GHz into the corresponding direct current voltage. The logarithmic amplifier has a good dynamic range and accurate temperature performance, including Automatic Gain Control (AGC), transmitter power measure, Received Signal Strength Indicator (RSSI) of the terminal device and so on. The direct current voltage is directly converted into digital information by A/D inside the control unit, the work status of the antenna may be obtained by comparing the digital information with a reference value.

Figure 12:
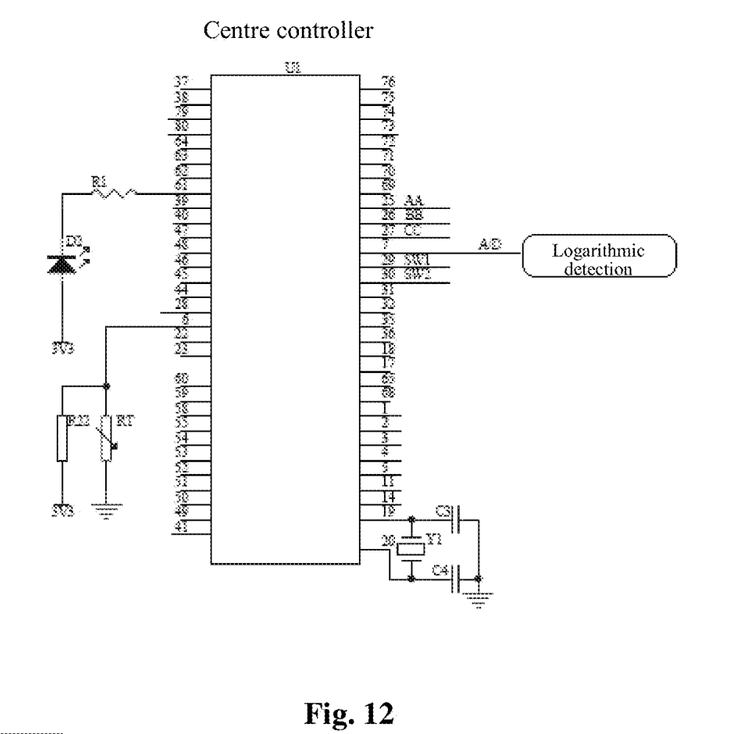
FIG. 12 is a structural diagram of a controller provided by an embodiment of the invention.

The circuit diagram of the controller is shown in FIG. 12, in which, the A/D converting and so on is integrated within the controller, in the circuit design, errors caused by many periphery factors, such as errors of the system caused by the accuracy of multiple ICs, resistors and capacitors, are decreased, and thereby the system accuracy is improved.

Figure 13:
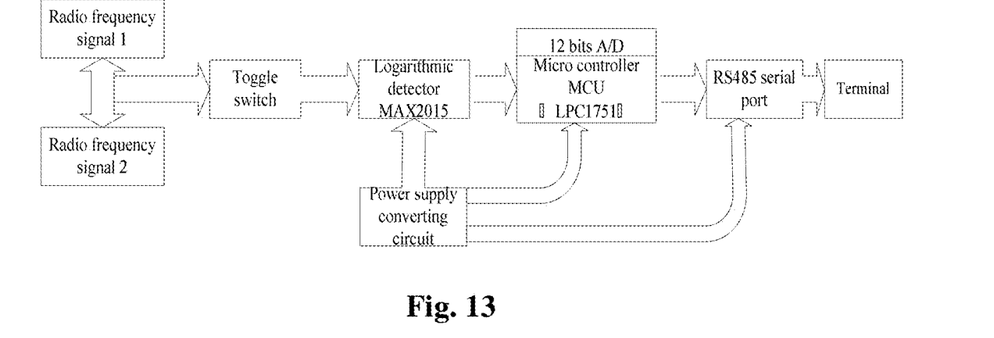
FIG. 13 is a schematic structural diagram of an integrated monitoring device provided by an embodiment of the invention.

FIG. 13 shows another specific structure of an integrated monitoring device 102 provided by an embodiment of the invention, the integrated monitoring device includes: a toggle switch, a logarithmic detector MAX2015, a MicroController Unit (MCU) (LPC1751), a RS485 serial port and a power supply converting circuit. The power supply converting circuit is configured to supply power to the logarithmic detector MAX2015, the MCU (LPC1751) and the RS485 serial port. The toggle switch may select a transmission signal of an antenna element of a base station and output it to the logarithmic detector MAX2015. For example, the signals of the detection ports A to D or the signals of the detection ports E to H as shown in FIG. 2 may be periodically selected and output to the logarithmic detector MAX2015. Of course, the toggle switch may be not set, the signals of the detection port A to H may be all directly input to the logarithmic detector.

In the integrated monitoring device, an LPC1751 low power consumption chip is utilized, the chip has an RISC kernel of ARM Cortex-M3 V2 version 32 bits, its work frequency is 100 MHz, a high speed memory and an Analog-to-Digital Converter (ADC) with 12 bits resolution are arranged within the chip, and the chip works within a temperature range between −40 degree Celsius to 105 degree Celsius. The supply voltage of the power supply converting circuit is 2.0V to 3.6V. A radio frequency power sensor circuit, a radio frequency switch circuit, a microprocessor circuit, a power supply interface and a communication interface are integrated within the chip LPC1751. The control software used in the microprocessor circuit may accurately measure the change amounts of the radio frequency signals of ports A to H, and output an alarm signal for the communication device to monitor.

Multiple logarithmic amplifiers MAX2015 may be arranged. For example, two logarithmic amplifiers MAX2015 may be arranged, one is configured to perform detection to the signals output from ports A, port B, port C and port D, and the other is configured to perform detection to the signals output from port E, port F, port G and port H.

Each logarithmic amplifier MAX2015 may convert the radio frequency signal in a frequency range of 0.1 GHz to 3 GHz of the power divider circuit into the corresponding direct current signal. The logarithmic amplifier has a great dynamic range and accurate temperature performance. MAX2015 may also work in a controller mode, to measure, compare and control the output power of a variable gain amplifier, in which MAX2015 functions as a part of a totally integrated Automatic Gain Control (AGC) loop. Compared with the controller based on a diode detector, the logarithmic amplifier has a wider measure range and a higher accuracy, as well as good temperature stability within the whole work range between −40 degree Celsius and +85 degree Celsius.

In the embodiments of the invention, when one or both of the two elements at the lower part of the right column of antennas shown in FIG. 2 are damaged, the impedance matching of the feed network fails, the radio frequency reflected signal on the power divider circuit composed of the two elements is enhanced, the direct current portion of the extracted radio frequency reflected signal will also be enhanced accordingly; whether the elements work abnormally can be determined by monitoring the change of the strength of the direct current signal.

The radio frequency signal output from port A is performed with detection, rectification and analog-to-digital conversion, and then is sent to a control platform in a wired way (via the communication cable of an antenna port, based on the AISG protocol) or a wireless way. The work state of the antenna elements may be monitored by a display device of the control platform, thereby achieving long distance monitoring. In the embodiments of the invention, as to port B, port C, port D, port E, port F, port G and port H, the measure and monitoring principle is the same as the principle for port A. Therefore, the work state of the antenna elements corresponding to each port may be monitored according to the embodiments of the invention.

It can be seen from above that, the integrated monitoring device provided by the embodiments of the invention has the following characteristics:

a small volume, the integrated monitoring device may not only be integrated with the feed network portion of the base station antenna, but also be arranged externally on the base station antenna, it can monitor the base station antenna already in a network in real time without changing the internal structure of the antenna, and it is detachable, which facilitates the measure for the same type of antenna;

a high measure accuracy;

the return loss (i.e., a standing wave ratio) of a specific power divider circuit of an antenna may be measured online, and an alarm signal is output; and it is convenient to be used.

In summary, in the monitoring system for the antenna element of the base station provided by the embodiments of the invention, the radio frequency reflected signal is coupled by the radio frequency coupler arranged at the power divider circuit of the array antenna, or the radio frequency signal of the element is sensed by the magnetic ring sensor outside of the array antenna; the coupling signal output by the radio frequency coupler or the sensing signal output by the magnetic ring sensor is input to the logarithmic detector and the analog-to-digital converter, the direct current signal corresponding to the radio frequency signal is output; the change of the output direct current signal is monitored in real time by the microprocessor, thereby the change of the radio frequency signal of the array antenna elements is shown; the obvious change of the direct current signal is monitored and obtained by the microprocessor, and is input to the display device, which directly shows an alarm signal under this state.

The technical schemes provided by the embodiments of the invention are not restricted to be applied in the monitoring of the 2×4 dual-polarized planar array, they can also be applied in the monitoring of the array antenna including two or more antenna elements, such as a TD-SCDMA intelligence antenna, an antenna of the LTE system and other base station antennas.

Compared with the prior art, the technical schemes provided by the embodiments of the invention has a simple principle, and the product based on the technical schemes has a low cost and is easy to produce in bulk. Since the technical schemes provided by the embodiments of the invention can directly monitor the abnormality of the transmission signal of the array antenna elements, the abnormality of the antenna caused by an individual damaged element can be accurately determined. However, as to the existing technical schemes for the base station standing wave alarm, the determining ability thereof is limited; when an individual element is damaged, the standing wave at the main port of the antenna changes a little, hence no alarm signal can be sent, but the parameters such as antenna pattern will be changed obviously.

Those skilled in the art should understand that, the embodiments of the invention may be implemented as a method, a system or a computer program product. Therefore, the invention may be implemented by employing only hardware, by employing only software, or employing a combination of software and hardware. In addition, the invention may be implemented as a computer program product performed on one or more computer usable storage mediums (including but not limiting to a magnetic disc memory and an optical memory etc.), which include computer usable program codes.

The invention is described by referring to the flowcharts and/or block diagrams of the method, the device (the system) and the computer program products according to the embodiments of the invention. It should be understood that, each flow and/or block in the flowchart and/or block diagram and a combination thereof may be achieved by the computer program instructions. These computer program instructions may be provided to a general purpose computer, a dedicated computer, an embedding processor or the processor of other programmable data processing device so as to generate a machine, such that a system for achieving the functions specified in one or more flows in the flowchart and/or one or more blocks in the block diagram is generated by performing the instructions by the computer or the processor of other programmable data processing device.

The computer program instructions may also be stored in a computer readable memory which can guide a computer or other programmable data processing device to work in a set way, such that the instructions stored in the computer readable memory generate manufactures including the instruction system, which achieves the functions specified in one or more flows in the flowchart and/or in one or more blocks in the block diagram.

The computer program instructions may also be loaded to a computer or other programmable data processing device, such that a series of operation steps are performed on the computer or other programmable device to generate the process implemented by the computer, thereby the instructions performed on the computer or other programmable device provide steps for achieving the functions specified in one or more flows in the flowchart and/or one or more blocks in the block diagram.

Obviously, those skilled in the art can make various changes and modifications to the invention without departing from the spirit and scope of the invention. If these changes and modifications of the invention fall within the scope of the claims of the invention and the equivalent technology thereof, the invention is intended to include the changes and modifications.

The invention claimed is:

1. A monitoring method for an antenna element of a base station, comprising:
performing detection and analog-to-digital conversion to an acquired transmission signal of the antenna element of the base station, to obtain a digital signal of a direct current signal of the transmission signal; and
determining a change amplitude of the digital signal within a set time period, and if the change amplitude is greater than a preset change amplitude threshold, determining that the antenna element is abnormal, and if the change amplitude is not greater than the preset change amplitude threshold, determining that the antenna element is normal.

2. The method according to claim 1, wherein the way to acquire the transmission signal of the antenna element of the base station comprises:

coupling a transmission signal of a last stage power divider circuit of the base station by a radio frequency coupler, wherein each last stage power divider circuit connects two or more elements with a same polarization; or coupling a transmission signal of a second last stage power divider circuit of the base station by a radio frequency coupler, wherein each second last stage power divider circuit connects two or more elements with a same polarization; or inducing the transmission signal of the antenna element of the base station by a magnetic ring sensor.

3. The method according to claim 2, wherein after determining that the antenna element is abnormal, the method further comprises:

generating an alarm signal corresponding to the antenna element, and sending the alarm signal to a control platform.

4. The method according to claim 1, wherein after determining that the antenna element is abnormal, the method further comprises:

generating an alarm signal corresponding to the antenna element, and sending the alarm signal to a control platform.

5. The method according to claim 4, wherein the sending the alarm signal to the control platform comprises:

sending the alarm signal to the control platform via a radio frequency cable; or embedding the alarm signal into a radio frequency signal transmitted by the antenna element of the base station with an Antenna Interface Standards Group, AISG protocol, and sending the radio frequency signal to the control platform via a radio frequency cable connecting an antenna port with the base station; or sending the alarm signal to the control platform wirelessly.

6. A monitoring system for an antenna element of a base station, comprising:

a signal acquiring unit, configured to acquire a transmission signal of the antenna element of the base station; and an integrated monitoring device, configured to: perform detection and analog-to-digital conversion on the acquired transmission signal of the antenna element of the base station, to obtain a digital signal of a direct current signal of the transmission signal; determine a change amplitude of the digital signal within a set time period; if the change amplitude is greater than a preset change amplitude threshold, determine that the antenna element is abnormal; and if the change amplitude is not greater than the preset change amplitude threshold, determine that the antenna element is normal.

7. The system according to claim 6, wherein the signal acquiring unit comprises a radio frequency coupler for coupling each last stage power divider circuit of the base station, and wherein each last stage power divider circuit connects two or more elements with a same polarization.

8. The system according to claim 7, wherein the integrated monitoring device comprises:

a logarithmic detector, configured to receive the transmission signal of the antenna element of the base station, and perform detection to the transmission signal to output a direct current signal of the transmission signal of the antenna element of the base station to an analog-to-digital converter;

an analog-to-digital converter, configured to convert the direct current signal of the transmission signal of the antenna element of the base station into a digital signal, and output the digital signal to a microcontroller; and a microcontroller, configured to: determine a change amplitude of the digital signal within a set time period; if the change amplitude is greater than a preset change amplitude threshold, determine that the antenna element is abnormal; and if the change amplitude is not greater than a preset change amplitude threshold, determine that the antenna element is normal.

9. The system according to claim 6, wherein the signal acquiring unit comprises a radio frequency coupler for coupling each second last power divider circuit of the base station, and wherein each second last stage power divider circuit connects two or more elements with a same polarization.

10. The system according to claim 9, wherein the integrated monitoring device comprises:

a logarithmic detector, configured to receive the transmission signal of the antenna element of the base station, and perform detection to the transmission signal to output a direct current signal of the transmission signal of the antenna element of the base station to an analog-to-digital converter;

an analog-to-digital converter, configured to convert the direct current signal of the transmission signal of the antenna element of the base station into a digital signal, and output the digital signal to a microcontroller; and a microcontroller, configured to: determine a change amplitude of the digital signal within a set time period; if the change amplitude is greater than a preset change amplitude threshold, determine that the antenna element is abnormal; and if the change amplitude is not greater than a preset change amplitude threshold, determine that the antenna element is normal.

11. The system according to claim 6, wherein the signal acquiring unit comprises a magnetic ring sensor for sensing a transmission signal of each antenna element of the base station.

12. The system according to claim 6, wherein the integrated monitoring device comprises:

a logarithmic detector, configured to receive the transmission signal of the antenna element of the base station, and perform detection to the transmission signal to output a direct current signal of the transmission signal of the antenna element of the base station to an analog-to-digital converter;

an analog-to-digital converter, configured to convert the direct current signal of the transmission signal of the antenna element of the base station into a digital signal, and output the digital signal to a microcontroller; and a microcontroller, configured to: determine a change amplitude of the digital signal within a set time period; if the change amplitude is greater than a preset change amplitude threshold, determine that the antenna element is abnormal; and if the change amplitude is not greater than a preset change amplitude threshold, determine that the antenna element is normal.

13. The system according to claim 6, wherein the integrated monitoring device comprises at least one control unit, and wherein each control unit comprises:

a toggle switch, configured to select a transmission signal of the antenna element of the base station and output the transmission signal to a detector;

a detector, configured to receive the transmission signal of the antenna element of the base station output from the toggle switch, perform detection to the transmission signal to output a direct current signal of the transmission signal of the antenna element of the base station to a controller; and a controller, configured to: convert the direct current signal of the transmission signal of the antenna element of the base station into a digital signal; determine a change amplitude of the digital signal within a set time period; if the change amplitude is greater than a preset change amplitude threshold, determine that the antenna element is abnormal; and if the change amplitude is not greater than the preset change amplitude threshold, determine that the antenna element is normal.

14. An integrated monitoring device, comprising:

a logarithmic detector, configured to receive a transmission signal of an antenna element of a base station, and perform detection to the transmission signal to output a direct current signal of the transmission signal of the antenna element of the base station to an analog-to-digital converter;

an analog-to-digital converter, configured to convert the direct current signal of the transmission signal of the antenna element of the base station into a digital signal, and output the digital signal to a microcontroller; and a microcontroller, configured to: determine a change amplitude of the digital signal within a set time period; if the change amplitude is greater than a preset change amplitude threshold, determine that the antenna element is abnormal; and if the change amplitude is not greater than the preset change amplitude threshold, determine that the antenna element is normal.

15. The device according to claim 14, further comprising a serial port unit, wherein:

the microcontroller is also configured to generate an alarm signal corresponding to the antenna element after it is determined that the antenna element is abnormal, and output the alarm signal to a serial port unit; and the serial port unit is configured to convert the alarm signal into a serial signal and send the serial signal to a control platform.

16. The device according to claim 15, further comprising an embedding unit, wherein:

the serial port unit is also configured to convert the alarm signal into a serial signal and send the serial signal to the embedding unit; and the embedding unit is configured to embed the serial signal into a radio frequency signal transmitted by the antenna element of the base station with an Antenna Interface Standards Group, AISG protocol, and send the radio frequency signal to the control platform via a radio frequency cable connecting an antenna port with the base station.

17. An integrated monitoring device, comprising at least one control unit, wherein each control unit comprises:

a toggle switch, configured to select a transmission signal of an antenna element of a base station and output the transmission signal to a detector;

a detector, configured to receive the transmission signal of the antenna element of the base station output from the toggle switch, perform detection to the transmission signal to output a direct current signal of the transmission signal of the antenna element of the base station to a controller; and a controller, configured to: convert the direct current signal of the transmission signal of the antenna element of the base station into a digital signal; determine a change amplitude of the digital signal within a set time period; if the change amplitude is greater than a preset change amplitude threshold, determine that the antenna element is abnormal; and if the change amplitude is not greater than the preset change amplitude threshold, determine that the antenna element is normal.

18. The device according to claim 17, wherein the control unit comprises a plurality of toggle switches which are connected in a cascade form, pin RF1 and pin RF2 of the toggle switches are configured for inputting transmission signals of different antenna elements of the base station, and pin RFC of the toggle switches is configured for outputting a transmission signal of an antenna element selected by the toggle switches to the detector or the next stage toggle switch.

19. The device according to claim 17, further comprising an adapter connecting with each control unit, wherein:

the controller is also configured to generate an alarm signal corresponding to the antenna element after it is determined that the antenna element is abnormal, and output the alarm signal to the adapter; and the adapter is configured to convert the received alarm signal into a serial signal and send the serial signal to a control platform.

20. The device according to claim 19, further comprising an embedding unit, wherein:

the adapter is also configured to convert the received alarm signal into a serial signal and send the serial signal to the embedding unit; and the embedding unit is configured to embed the serial signal into a radio frequency signal transmitted by the antenna element of the base station with an Antenna Interface Standards Group, AISG protocol, and send the radio frequency signal to the control platform via a radio frequency cable connecting an antenna port with the base station.

* * * * *